United States Patent
Herges (10) Patent No.: US 10,627,440 B2
(45) Date of Patent: Apr. 21, 2020

(54) METHOD AND DEVICE FOR DETECTING ARCS

(71) Applicant: Peter Herges, Stuttgart (DE)

(72) Inventor: Peter Herges, Stuttgart (DE)

(73) Assignee: Peter Herges, Stuttgart (DE)

( * ) Notice: Subject to any disclaimer, the term of this patent is extended or adjusted under 35 U.S.C. 154(b) by 536 days.

(21) Appl. No.: 15/319,201

(22) PCT Filed: Jun. 15, 2015

(86) PCT No.: PCT/EP2015/063296
§ 371 (c)(1),
(2) Date: Dec. 15, 2016

(87) PCT Pub. No.: WO2015/197399
PCT Pub. Date: Dec. 30, 2015

(65) Prior Publication Data
US 2017/0153285 A1    Jun. 1, 2017

(30) Foreign Application Priority Data

Jun. 25, 2014   (DE) .................. 10 2014 108 870

(51) Int. Cl.
*G01R 31/12* (2020.01)
*H02H 1/00* (2006.01)
(Continued)

(52) U.S. Cl.
CPC ....... *G01R 31/1272* (2013.01); *G01R 31/006* (2013.01); *G01R 31/007* (2013.01); *G01R 31/025* (2013.01); *H02H 1/0015* (2013.01)

(58) Field of Classification Search
CPC .................. G01R 31/1272; G01R 31/025; G01R 31/006; G01R 31/007; H02H 1/0015
(Continued)

(56) References Cited

U.S. PATENT DOCUMENTS

2006/0092585 A1   5/2006  Chan et al.

FOREIGN PATENT DOCUMENTS

DE   199 35 439 A1   2/2001
DE   101 32 750 A1   1/2003
(Continued)

OTHER PUBLICATIONS

Neubert Joachim, Date: Apr. 17, 2014; Line network, in particular an on-board DC electrical system for a motor vehicle, and method for monitoring a line network for the occurrence of an arc; Figures, Abstract, entire specification (Year: 2014).*

*Primary Examiner* — Dharti H Patel
(74) *Attorney, Agent, or Firm* — Pauley Erickson & Kottis (57) ABSTRACT

A method for detecting arcs in a DC circuit, having a detection conductor, which is routed at least along a conductor of the DC circuit, which carries an electric voltage and is to be monitored. In this connection, a voltage signal that refers to a potential of the DC circuit is coupled into the detection conductor at an incoupling point via a series resistor, the voltage signal is coupled out again at an outcoupling point of the detection conductor, the voltage signal before the series resistor is compared to the voltage signal at the outcoupling point, and a conclusion is drawn that an arc has occurred when the voltage signal at the outcoupling point deviates from the voltage signal before the series resistor by more than a predetermined amount. This invention also relates to a device for carrying out the method. The method and the device permit a quick, reliable detection of an arc in a DC circuit.

22 Claims, 4 Drawing Sheets (51) Int. Cl.
*G01R 31/00* (2006.01)
*G01R 31/02* (2006.01)

(58) Field of Classification Search
USPC .............................................................. 361/2
See application file for complete search history.

(56) References Cited

FOREIGN PATENT DOCUMENTS

| | | |
|---|---|---|
| DE | 101 50 377 A1 | 4/2003 |
| DE | 101 32 752 B4 | 5/2003 |
| DE | 10 2012 019 996 A1 | 4/2014 |
| EP | 1 553 422 A1 | 7/2005 |
| EP | 2 466 709 A1 | 6/2012 |
| WO | WO 99/30400 A1 | 6/1999 |

\* cited by examiner

METHOD AND DEVICE FOR DETECTING ARCS

BACKGROUND OF THE INVENTION

Field of the Invention

This invention relates to a method for detecting arcs in a DC circuit, having a detection conductor, which is routed along a DC circuit conductor, which carries an electric voltage and is to be monitored, and also relates to a device for carrying out the method.

Discussion of Related Art

A method and device of this type are disclosed in German Patent Reference DE 101 32 750 A1. This reference describes a fuse array for an electric line in a motor vehicle. In this case, a twin conductor is routed along a conductor to be monitored or a wiring harness to be monitored. The two lines of the twin conductor are separated from each other by an insulation and are contacted by a different potential. A short circuit in the line/wiring harness to be monitored causes the insulation to melt and the conductors of the twin conductor to come into contact. As a result, current flows between the conductors, which is detected and evaluated for an arc detection. In this known embodiment, according to one exemplary embodiment, one conductor is contacted with a predetermined potential and the second conductor is contacted to ground. In another embodiment, the potential difference is created by a voltage divider, with a voltage being supplied via a first resistor to a first conductor of the twin conductor at the front end of the latter. Both of the twin conductors are connected to a second resistor at their ends. The front end of the second conductor is connected to ground via a third resistor. This known fuse array is designed so that the two conductors of the detection conductor must be routed in such a way along the electrical line to be monitored that they come into electrical contact in the event of a short circuit.

German Patent Reference DE 10 2012 019 996 A1 describes a method for monitoring a line network for arcs. For this purpose, a sensor line is connected to ground via a first resistor and a ground line. A voltage increase in the sensor line is evaluated. This can take place when the ground line is interrupted by an arc or when, after an arc, an electrical contact with a voltage-carrying line of the line network to be monitored occurs. This known design is an active safety system that is currentless in the basic state and results in a current flow in the event of a fault.

Today, the electrical system of passenger vehicles is operated with 12 V. By contrast, an electrical system of 42 V or 48 V offers significant advantages particularly in the form of a $CO_2$ reduction due to improved recuperation possibilities or in the form of a possible reduction in vehicle weight. Consequently, the voltages provided are below the contact protection range, which starts at 60 V and require special safety precautions.

With increasing voltage, the risk of arc formation increases. An arc can occur between two components at different potentials, for example between a plus cable and a minus cable or also along the current path in the vicinity of elevated transmission resistances. Elevated transmission resistances are caused, for example, by corroded contact points or due to damaged electrical conductors. Whereas a voltage of 12 V is still below the necessary discharge voltage of an arc, for vehicles supplied with 42 V or 48 V, there is an increased risk of such an arc formation, which stabilizes at approximately 20 V and thus represents a significant fire risk for the vehicle and a corresponding hazard to people. In this case, fuses that are provided to monitor electrical consumers and their feed lines do not react or only react in a delayed fashion since the currents occurring in an arc between two components with a different potential are low in comparison to a direct short circuit and in an arc along the current path, can even be reduced relative to the regular operation of a connected consumer.

The German Patent Reference DE 101 32 752 B4 discloses a method and device for protecting a conductor when an arc occurs. In this case, an insulated detection line is routed along the supply line to be monitored. If an arc occurs, the insulation of the detection line melts and a direct contact occurs between the detection line and the supply line. This produces a current flow in the detection line, which is used for detecting an arc. The disadvantage here is that a direct contact between the detection line and the supply line is required in order to produce the current flow that is characteristic of an arc. This occurs in the uncontrolled, hot region of an arc in which insulation material, when a corresponding generation of gas occurs, can abruptly catch fire. On the other hand, the supply line and the detection line can be separate from each other in the region of the arc, as a result of which the current flow does not occur or falls below a range that can be reliably assessed. In this case, the reference provides for the use of a special insulation material with a melting point between 130° and 180°, which flows away in a controlled fashion in the event of an arc. In the vicinity of an arc, however, temperatures of significantly greater than 1000° C. occur, which causes the insulation material to disintegrate. Another disadvantage lies in the fact that the system is an active safety system which is currentless during regular operation and in the event of a fault, conveys a detectable current. A defect in the safety system, for example due to corroded contacts of the detection line, can, in the event of a fault, result in the fact that despite the occurrence of an arc, it is not possible for current to flow in the detection line and the arc therefore remains undetected. In order to avoid this, complex and correspondingly expensive contacts are required. In order to comply with safety standards for an active safety circuit in the automotive sector, it is necessary to continuously check this circuit, for example by monitoring the resistance of the detection line. This is also very complex and is connected with corresponding costs.

The German Patent Reference DE 101 50 377 A1 describes a method and device for short circuit detection in signal lines of a sensor. For this purpose, in addition to the sensor signal, a static reference potential is applied via a series resistor to the signal line to be monitored. A short circuit exists when the static potential in the signal line after the series resistor lies outside a predetermined range. The method can only be used for signal lines, which are operated essentially without power and in which the signal curve is detected and evaluated in a correspondingly high-impedance manner. Supply lines of a consumer in a DC circuit cannot be overlaid with a static reference potential since this immediately results in an altered power consumption of the consumer and, with a limited power of the reference voltage source, causes a change in the static potential to be monitored.

German Patent Reference DE 199 35 439 A1 discloses a sensor line with at least two connector elements that are separated by an insulator. The insulator is composed of a material that has an electrical conductivity that can be changed by external influences such as a temperature increase. If the temperature in a region of the sensor line increases, for example due to a fire, the conductor elements are short-circuited by the insulator, which has been become conductive. This short circuit is detected and by it, a potential fire source is detected. One disadvantage of this method is the fact that a special plastic is required for the insulator, which is conductive at higher temperatures (T≥80° C.). Another disadvantage is that even this plastic disintegrates at the high temperatures that occur in an arc so that no conductive phase is produced. An arc detection is therefore not possible with the described sensor line.

As has already been described in connection with German Patent Reference DE 101 32 752 B4, the device known from German Patent Reference DE 199 35 439 A1 disadvantageously constitutes an active safety system that is currentless during regular operation and in the event of a fault, carries a current that is to be detected. One defect in the safety system, for example due to corroded contacts of the detection line, can therefore also, in the event of a fault, result in the fact that despite the conductive connection between the conductor elements, no current flow in the detection line is possible and the fault will therefore remain undetected. The device therefore cannot be certified for use in the automotive sector.

SUMMARY OF THE INVENTION

One object of this invention is to provide a method that permits a reliable, inexpensive detection of an arc in a DC circuit. Another object of this invention is to provide a corresponding device.

The above and other objects of this invention relating to the method are attained if a voltage signal that refers to a potential of the DC circuit is coupled into the detection conductor at an incoupling point via a series resistor, the voltage signal is coupled out again at an outcoupling point of the detection conductor, the voltage signal before the series resistor is compared to the voltage signal at the outcoupling point, and the conclusion is drawn that an arc has occurred when the voltage signal at the outcoupling point deviates from the voltage signal before the series resistor by more than a predetermined amount. During regular operation, the detection conductor carries no electrical charge or carries only a slight electrical charge due to the high-impedance voltage measurement. Consequently, the voltage signals before and after the series resistor are at least almost the same. If an arc occurs, due to the very high temperatures accompanying it, this immediately results in an ionized and therefore conductive atmosphere in the vicinity of the arc. The combustion products of insulation materials, for example of a cable that is to be monitored, also contribute to this ionized atmosphere. This ionized atmosphere enables a flow of current from the detection conductor. When a current flow occurs, the voltage drop via the series resistor increases so that the voltage at the outcoupling point of the detection conductor decreases. This is detected by comparing the voltage signals before the series resistor and at the outcoupling point and as a result, the arc is detected.

Through a suitable selection of the series resistor, even with a comparatively low current load of the detection conductor via the ionized atmosphere, a significant change in the voltage at the outcoupling point is produced so that it is possible to already detect an arc early in its creation.

Another advantage of this invention is that the arc recognition is embodied in the form of a passive safety system. A voltageless state of the detection conductor is detected as an arc by the steps that are then provided. If such a voltageless state occurs due to another fault, for example due to corroded contacts or an interrupted detection conductor conductor, then these steps are also taken and the full safety is achieved. There is thus a continuously closed detection circuit, which is continuously checked for interruptions and in the event of an interruption, initiates performance of the provided safety steps. The method therefore makes it possible to meet the requirements with regard to fail safety of safety-relevant components that are applicable, for example, to motor vehicles. Fault rates of $10^{-10}$ faults per year are achievable since the safe state is the switched off state.

Another advantage of the method of this invention is that a direct contact between the detector conductor and another conductor of the DC circuit, which does not occur under unfavorable circumstances inside the arc, is not required. For the evaluation, it is sufficient if the detection conductor is routed through the ionized region of the arc. At the same time, however, a voltage change occurs in the detection conductor, even if such a direct contact is present so that in both cases, a reliable detection of an arc is enabled.

So that in the event of an arc, the detection conductor is electrically charged in a reliable fashion, the voltage signal refers to a potential of the DC circuit. This can be the minus potential, but can also be the plus potential and as a result, can be the operating voltage of the DC circuit or a potential that lies between the minus potential and the plus potential.

According to different embodiments of this invention, a DC voltage signal, an AC voltage signal, or a DC voltage signal that is overlaid with an AC voltage can be used as the voltage signal. A DC voltage signal can be easily and inexpensively produced in the DC voltage system to be monitored. By contrast, an AC voltage offers the advantage of a reliable detection. Under the indefinite conditions of an arc, arbitrary DC voltages from ground to the voltage of the voltage signal or of the supply voltage of the DC circuit can occur in the detection conductor, which complicates the task of fault detection based on a DC voltage signal. An AC voltage, however, can be clearly distinguished from the possibly overlaid DC voltages and can be reliably evaluated. In this case, sinusoidal voltages can be provided, but any other AC voltages such as sawtooth voltages, delta voltages, and square wave voltages can also be provided. The selection can be carried out in a phase-selective and/or frequency-selective fashion in order to reliably exclude interference voltages.

According to one embodiment of this invention, the power supply of the DC circuit can be interrupted when an arc is detected. This results in the immediate extinguishing of the arc, which makes it possible to avoid more significant damage.

One object of this invention relating to the device is achieved if the detection conductor is connected at an incoupling point via a series resistor to a signal source that outputs a voltage signal, the voltage signal of the signal source refers to a potential of the DC circuit to the monitored, the voltage signal output by the voltage source and a voltage signal output at an outcoupling point of the detection conductor are supplied to a comparator, and the device is associated with a processing device that detects an arc if the voltage signal, which is present at the outcoupling point, deviates from the voltage signal, which is output by the signal source, by more than a predetermined amount. The device thus makes it possible to carry out the above-described method in which a current flow that is enabled by the ionized atmosphere near or in the vicinity of an arc, starting from the detection conductor, results in a change in the voltage signal at the outcoupling point while the voltage signal before the series resistor remains constant. The comparison of the voltage signals can be carried out by a difference measurement in the comparator. Alternatively, the voltage signals before the series resistor and at the outcoupling point can also be detected separately and then compared. The processing device can be provided in the form of an electronic circuit or else a microprocessor can be provided as the processing device, which detects a voltage difference determined by the comparator and then decides whether or not an arc is occurring. As a decision criterion for the presence of an arc, it is also possible to select the fact that the voltage signal is no longer present at the outcoupling point and that the predetermined amount therefore corresponds to the amount of the voltage signal.

In order to enable a current flow through the ionized atmosphere of an arc between the detection conductor and a conductor of the DC circuit, the voltage signal of the signal source must refer to a potential of the DC voltage circuit to be monitored.

According to one embodiment of this invention, the detection conductor is embodied as a closed conductor loop with the incoupling point and the outcoupling point being located at the ends of the conductor loop. In order to monitor, for example, a cable carrying the conductor of the DC circuit, starting from the incoupling point, the detection conductor can extend with a feed along the cable and then back along the cable via a return to the incoupling point at the beginning of the cable. This arrangement makes it possible to place the incoupling point and the outcoupling point at one end of the cable, which permits a simple connection to an electronic circuit having the signal source, the series resistor, and the comparator. In this case, both the feed and the return are positioned along the conductor to be monitored, in or on the cable, making it possible for at least a part of the detection conductor to reliably be positioned or situated near or in the vicinity of an occurring arc. The voltage signal of the signal source is coupled via the series resistor at the incoupling point of the detection conductor. At the end of the detection conductor, the voltage signal is picked off at the outcoupling point and supplied to the comparator. If an arc occurs, then the ions occurring in the arc distort the voltage signal so that this can be clearly detected in the voltage signal that is present at the end of the detection conductor.

In order to be able to monitor a conductor of the DC circuit over its entire length, at contact points of the DC circuit to be monitored, the detection conductor can likewise be embodied as a contact and/or the contact of the detection conductor can be embodied as an interlock circuit with a delay device, in particular a lagging contact or a leading contact. The detection conductor can therefore be integrated into a plug of a DC circuit, for example in the form of an additional plug contact. It is thus also possible to monitor contact points of the DC circuit such as the above-mentioned plug for an arc that has formed therein. If the contact of the detection conductor is embodied as an interlock circuit with a delay device, then it is possible to increase the safety standard for the contact point. In an interlock circuit of this kind, it is first necessary to disengage the contact of the detection conductor, for example by unscrewing, before the main plug of the DC circuit can be opened. Before the plug is disconnected, the DC circuit is interrupted. If this is step forgotten, then the opening of the detection conductor results in the DC circuit being switched off. This makes sense, for example, for electric connections to trailers of commercial vehicles since this reliably switches off the power supply before the main plug is disconnected.

In order to be able to detect arcs in the entire DC circuit, it is possible for the detection conductor to be routed through consumers or alongside consumers of the DC circuit and/or for the detection conductor to be routed through cables or alongside cables of the DC circuit. In this case, the detection conductor is advantageously laid inside a housing, for example, of the consumer because the atmosphere inside the housing is immediately ionized in the event of an arc, thus permitting a very quick detection of the arc. In order to obtain a large monitoring region, the detection conductor can be embodied with a correspondingly large area near or in the vicinity of consumers, for example in the form of a sensor plate. Possible consumers to be monitored include air conditioner compressors, alternators, starters, drive electronics, or power steering units. When monitoring consumers for arcs, it is advantageous that these are mostly high-quality and correspondingly expensive components whose complete destruction can be avoided with prompt detection of an arc and a corresponding switching off of the power supply. By routing the detection conductor through or alongside cables of the DC circuit, it is possible to monitor them form arcs.

The series resistor and the resistance that is produced inside the arc between the detection conductor and a reference potential combine to produce a voltage divider. Through a suitable selection of the series resistor, the voltage divider can be embodied so that when the expected resistances inside the arc occur, a maximum change in the voltage signal at the outcoupling point occurs. This can be achieved if the series resistor lies in a range between 10 ohm and 10,000 ohm (10 k ohm), for example between 100 ohm and 10,000 ohm, preferably in a range between 300 ohm and 3000 ohm. With a series resistor of for example 1000 ohm, it is possible to already detect arcs as they are being created, while the gas that is still only slightly ionized by comparison and thus a correspondingly high resistance is present, with the aid of the disrupting voltage signal at the outcoupling point. In vehicles like buses, there are relatively large cable lengths to monitor. In order to achieve a high power at the detection conductor, it can be advantageous, for example, to work with a series resistor in the range from 10 ohm to 50 ohm.

It is possible for the signal source to be embodied as an AC voltage source, a DC voltage source, or an AC voltage source with an overlaid DC voltage offset. The use of an AC voltage source offers one advantage of a simple differentiation from DC voltages, which can be transmitted from the DC circuit to the detection conductor with the occurrence of an arc. DC voltage sources, however, are simpler and less expensive to produce in the DC circuit environment that is to be monitored.

In order to be able to avoid more significant damage with the occurrence of an arc, it is possible for the processing device to be designed to react to the detection of an arc by tripping a circuit breaker, which interrupts the power supply of the DC circuit. To interrupt the power supply, heavy-duty circuit breakers can be used, which for example disconnect a battery or a generator of a motor vehicle from the DC circuit. They are designed to reliably switch, even under short-circuit conditions with powerful currents, without an arc occurring in the circuit breakers themselves. Heavy-duty circuit breakers can be provided in the form of heavy-duty disconnect relays, electronic circuit breakers, or pyrotechnic fuses. The heavy-duty circuit breaker can be positioned directly on or in the battery or on or in the generator.

According to different embodiments of this invention, the detection conductor is embodied as insulated in at least some areas and/or the detection conductor is embodied without insulation in at least some areas. An insulated detection conductor can be placed in direct contact without the danger of an inadvertent short circuit with the DC circuit conductor that is to be monitored. If an arc occurs, the insulation is destroyed and the ionized and thus conductive atmosphere forms. With a bare detection conductor, it is not necessary for an insulation to burn first, thus resulting in a very quick reaction speed upon occurrence of an arc. Advantageously, a part of the detection conductor, for example the feed of a detection conductor embodied as a conductor loop, can be insulated and another part of the detection conductor, for example its return, can be bare so that the two advantages can be combined. With a bare detection conductor, care must be taken that it does not come into contact with other voltage-carrying components or with ground during normal, arc-free operation. In one embodiment, the detection conductor can be routed in a tube together with a cable that is to be monitored.

Bare detection conductors are also advantageous particularly inside consumers. If an arc occurs inside the housing of a consumer, ionized and therefore conductive gas is immediately present in the entire interior. If bare detection conductor is used, then it is not necessary for an insulation of the detection conductor to first burn, so that it reacts very quickly to the ionized atmosphere that has formed. The use of a bare detection conductor for monitoring consumers is also advantageous because temperatures high enough to burn an insulation of the detection conductor are not present throughout the entire housing. By contrast with an insulated detection conductor, a bare detection conductor reacts even if it is not routed through a region of a very high temperatures inside the housing of the consumer, as long as the atmosphere in the housing is sufficiently ionized.

Corresponding to another embodiment of this invention, it is possible for consumers of the DC circuit to be connected to a vehicle ground on one side and for the supply voltage to be conveyed to the consumers via plus lines that are monitored by detection conductors. Without the arc monitoring according to this invention, consumers in motor vehicles equipped, for example, with 42 V or 48 V electrical systems are electrically supplied via separate plus lines and minus lines. The use of a shared vehicle ground as the minus pole, as is customary in 12 V electrical systems, is not provided due to the significant risk of arc formation between voltage-carrying lines and ground. With the arc detection according to the invention and interruption of the power supply of the DC circuit when an arc is detected, it is once again possible to provide a shared vehicle ground without an increased risk of arc formation and thus the triggering of a vehicle fire. By this measure, it is possible to significantly reduce both the costs for the wiring harness of a motor vehicle and the weight of the motor vehicle.

The method and device can preferably be used to monitor a DC circuit in a voltage range between 20 V and 60 V, for example between 24 V and 60 V, or to monitor a DC circuit in a motor vehicle in a voltage range between 20 V and 60 V, for example 24 V and 60 V, preferably in a voltage range between 40 V and 50 V.

BRIEF DESCRIPTION OF THE DRAWINGS

This invention is explained in greater detail in view of an exemplary embodiment shown in the drawings, wherein.

DETAILED DESCRIPTION OF THE INVENTION

Figure 1:
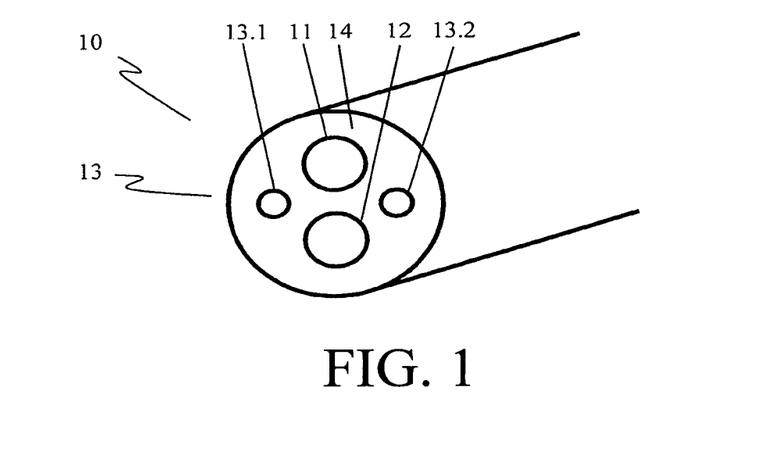
FIG. 1 shows a schematic, perspective front view of a section taken through a bipolar cable with a detection conductor.
Figure 2:
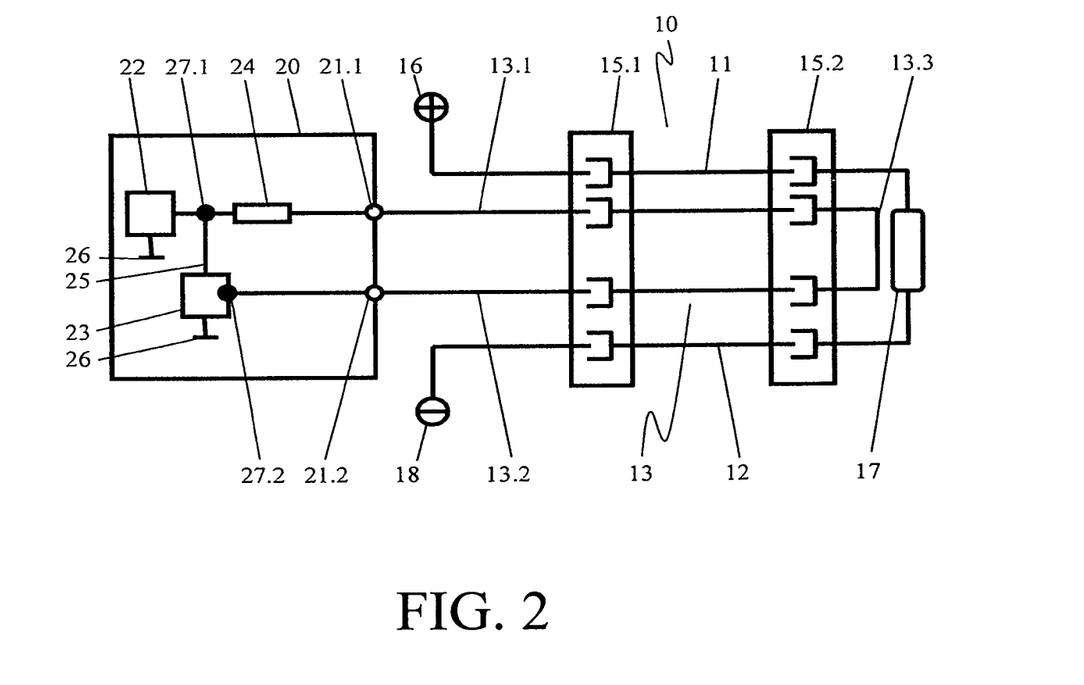
FIG. 2 is a schematic view of an electronic assembly for detecting arcs in a cable and a consumer of a DC circuit.
Figure 5:
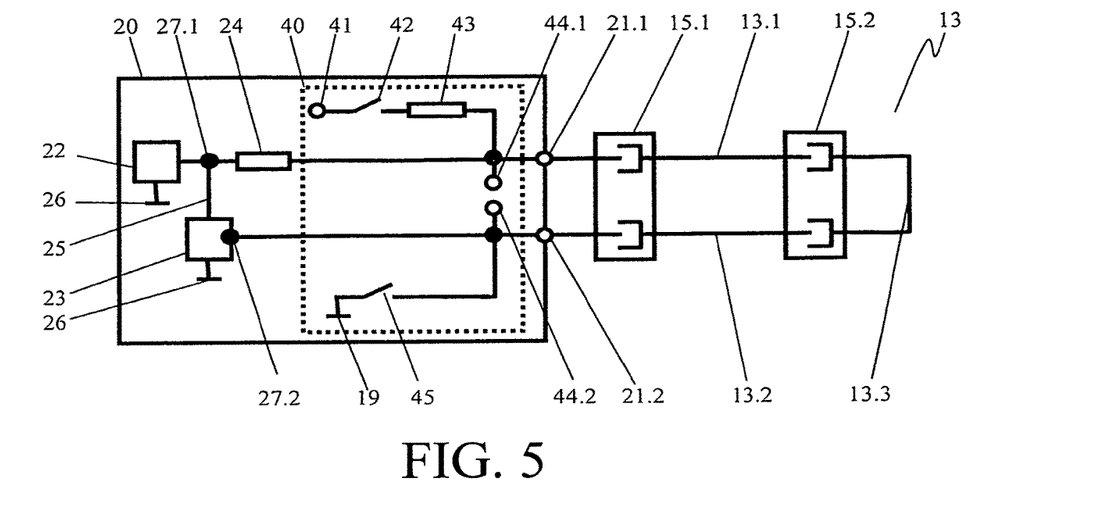
FIG. 5 shows an electronic assembly for detecting arcs, with an integrated safety circuit for monitoring the detection conductor.

FIG. 1 shows a schematic, perspective front view of a section through a bipolar cable 10 with a detection conductor 13. A plus line 11 and a minus line 12 of a DC circuit are routed inside the insulated casing 14. In addition to the plus line 11 and the minus line 12, a feed 13.1 and a return 13.2 of the detection conductor 13 are located inside the insulated casing 14. As shown in FIGS. 2 and 5, the feed 13.1 and the return 13.2 are connected to each other at the end of the cable 10 so that the detection conductor 13 constitutes conductor loop.

The cable 10 is part of a 48 V electrical system of a motor vehicle and is used to supply electrical energy to an electrical consumer 17 shown in FIG. 2. In an alternative embodiment, the detection conductor 13 can be routed outside the casing 14 or it can extend around the plus line 11 and the minus line 14, for example in a helical form, or can be embodied in the form of a net or a screen. The detection conductor 13 can also be conveyed in a tube around the cable 10 or around the plus line 11 or the minus line 12. In order to improve the interference distance, it is also possible for the detection conductor 13 to be embodied in the form of a twisted double line. It is also possible to provide two detection conductors 13 and thus to achieve a redundant system.

The detection conductor 13 is used for detecting arcs of the kind that can occur, for example, along a current path along the plus line 11 or the minus line 12 at faults with increased electrical resistance or between the plus line 11 and the minus line 12. Such arcs burn in a stable fashion starting at voltages of 20 V and can cause serious damage to the vehicle. With the change-over from the currently customary 12 V electrical system, with a voltage that lies under the necessary discharge voltage for arcs, to 42 V or 48 V electrical systems, the risk of such arcs forming rises considerably. If an arc occurs, for example at a corroded contact point of the plus line 11 or minus line 12 with an elevated electric resistance, then the current flow through the plus line 11 or minus line 12 generally decreases so that fuses provided in order to protect the cable 10 do not react. If arcs occur between the plus line 11 and the minus line 12, the current flow is in fact significantly greater, but it still lies in a range that can lead to a delayed reaction of the fuse.

If an arc occurs, then the air near or in the vicinity becomes ionized and therefore conductive. Insulation material situated near or in the vicinity of the arc is thermally disintegrated and contributes to the formation of an ionized atmosphere.

In order for arcs to be detected by the detection conductor 13, it is necessary for the detection conductor 13 to be routed close to the plus line 11 and the minus line 12 so that when an arc occurs, the conductor is routed through an ionized region produced by the arc. This can, for example, be achieved by the above-mentioned embodiments of the cable 10.

FIG. 2 is a schematic depiction of an electronic assembly 20 for detecting arcs in a cable 10 and a consumer 17 of a DC circuit.

The electronic assembly 20 includes a signal source 22, a series resistor 24, and a comparator 23. The signal source 22 is connected to the series resistor 24 and via a signal line 25 to the comparator 23. The series resistor 24 is connected to an incoupling point 21.1 at a loose end of the feed 13.1 of the detection conductor 13 that has already been introduced in connection with FIG. 1. The return 13.2 of the detection conductor 13 is connected to the comparator 23 via an outcoupling point 21.2. The feed 13.1 and the return 13.2 of the detection conductor 13 are routed together with the plus line 11 and the minus line 12 in the cable 10 that has likewise already been shown in FIG. 1. In this case, the plus line 11 is connected to a supply voltage 16 on the input side and the minus line 12 is connected to a minus potential 18 of a power supply that is not shown. The electrical consumer 17 is connected between the plus line 11 and the minus line 12 and is supplied with electrical energy via the cable 10. In the immediate vicinity of or near the electrical consumer 17, a loop 13.3 of the detection conductor 13 is routed, which connects the feed 13.1 and the return 13.2 of the detection conductor 13 so that the detection conductor 13 forms a closed conductor loop. Along the cable 10, a first contact point 15.1 and a second contact point 15.2 are embodied in the form of plug-in contacts. The contact points 15.1, 15.2 form contacts for the plus line 11 and the minus line 12 and also for the feed 13.1 and the return 13.2 of the detection conductor 13.

The signal source 22 and the comparator 23 refer to a shared reference potential 26 with the DC circuit, in the present case to the minus potential 18 of the DC circuit. Alternatively, the supply voltage 16 or an arbitrary reference voltage of the DC circuit can be provided as the reference potential 26.

The signal source 22 feeds a voltage signal into the feed 13.1 of the detection conductor 13 via series resistor 24 at the incoupling point 21.1. The voltage signal is conveyed via the contact points 15.1, 15.2 to the loop 13.3 and from there, via the return 13.2 and the contact points 15.1, 15.2 back to the outcoupling point 21.2. The comparator 23 carries out a high-impedance measurement of the voltage signals that are present at a measuring point MP1 27.1 before the series resistor 24 and at a measuring point MP 2 27.2 at the end of the detection conductor 13 and compares them. If no arc is present, then the conductor loop of the detection conductor 13 is only charged by the measurement current of the comparator 23. The voltage drop via the series resistor 24 is correspondingly negligible so that before the series resistor 24 and at the outcoupling point 21.2, the same voltage signal is present, with low tolerances. The comparator 24 recognizes that the voltage signals are the same and then a processing device, not shown, for example in the form of a microprocessor, decides that no arc is present near or in the vicinity of the cable 10, the contact points 15.1, 15.2, or the consumer 17. If an arc does occur, however, the atmosphere near or in the vicinity of the arc becomes ionized and thus conductive. The detection conductor 13 is positioned so that it is routed through this ionized region. Because of the shared reference potential 26 of the signal source 22 and the DC circuit, a current flows from the detection conductor 13 into the DC circuit. As a result, the voltage drop via the series resistor 24 increases so that the voltage signal at the outcoupling point 21.2 decreases relative to the voltage signal before the series resistor 24. This is determined by the comparator 23. If the difference between the voltage signals is greater than a predetermined permissible amount, then the processing device detects an arc.

Preferably, an AC voltage is provided as the voltage signal because it can be clearly distinguished from existing DC voltages of the kind that can be transmitted, for example, from the DC circuit to the detection line in the event of an arc. The series resistor 24 is chosen so that with the expected current load of the detection conductor 13 in an arc, a higher voltage drop at the series resistor 24 and thus a greater voltage difference between the voltage signal before the series resistor 24 and the voltage signal at the outcoupling point 21.1 is produced. Advantageously, a series resistor 24 in the range between 300 ohm and 3000 ohm is provided. As an arc is being created, when an ionization of the atmosphere is comparatively slight, a series resistor 24 of this kind already yields a significant voltage drop and consequently a clearly detectable change in the voltage signal at the outcoupling point 21.1 and thus at the measuring point MP2 27.2. With a corresponding choice of the series resistor 24, the voltage signal in the detection conductor 13 completely collapses, which is clearly detectable by the comparator 23.

The detection conductor 13 in the exemplary embodiment is routed together with the plus line 11 and the minus line 13 in the cable 10. In this case, the detection conductor 13 is likewise connected by contacts at the contact points 15.1, 15.2. The loop 13.3 is routed directly on or in the consumer 17. In this case, the detection conductor 13 can be embodied with a large area in the vicinity of the consumer 17 by being embodied in the form of a sensor plate. In this way, it is possible to detect arcs along the cable 10, in the contact points 15.1, 15.1, and in the consumer 17.

If an arc is detected, then the power supply of the DC circuit is interrupted. To that end, the DC circuit is provided with a heavy-duty circuit breaker, which for example disconnects a battery and/or a generator from the DC circuit. Heavy-duty circuit breakers can be provided in the form of relays, electronic circuit breakers, or pyrotechnic fuses. In this case, the heavy-duty circuit breaker can be positioned directly on or in the battery or on or in the generator.

The device shown is a passive safety system. Passive safety systems are characterized by the fact that the currentless state is the safe state. If a fault occurs, which causes the expected currents not to flow, then such a passive safety system switches to fault mode. In the present case, the safety system detects an arc and switches off the supply voltage 16 of the DC circuit if a fault occurs in the detection conductor 13 that changes the voltage signal at the outcoupling point 21.2. The system therefore reverts to the safe state in any case. There is a closed circuit of the detection conductor 13, which is continuously checked for interruptions during operation and which switches off in the event of an interruption in full safety mode. This offers significant advantages as compared to an active safety system, which is currentless in the basic state and results in a current flow in the event of a fault. In active systems of this kind, it is necessary to continuously and thus labor-intensively monitor the power connections and the transition resistances of the contacts of the sensor system. By the present passive safety system, it is possible to achieve very low fault rates in the range of $10^{-10}$ faults per year. This enables a certification in accordance with the applicable requirements for automobile safety circuits.

According to an embodiment that is not shown in the drawings, with flying connections, for example in electrical connections in semi-trailers, the detection conductor 13 can be embodied as an interlock circuit. With interlock circuits of this kind, it is first necessary for a sensor line, in the present case the detection conductor 13, to be interrupted before a main connector of the DC circuit can be disconnected. This allows the DC circuit to be reliably switched into a currentless state before the main connector is disconnected.

Figure 3:
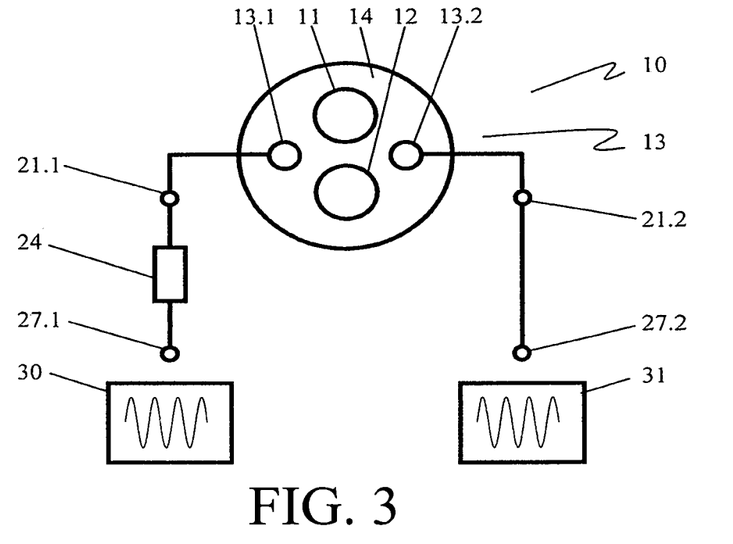
FIG. 3 shows the cable from FIG. 1 with signal curves for comparison, during regular operation of the DC circuit without arcs.

FIG. 3 shows the cable 10 already shown in FIG. 1 with signal curves 30, 31 for comparison, during regular operation of the DC circuit without arcs. In this case, the signal curve MP1 30 corresponds to the output signal of the signal source 22 shown in FIG. 2 at the measuring point MP1 27.1 before the series resistor 24. The signal curve MP2 31 is present at the measuring point MP2 27.2 and corresponds to the voltage signal, which occurs at the outcoupling point 21.2 at the end of the return 13.2 of the detection conductor 13.

As the output signal of the signal source 22, an AC voltage is provided, with a frequency in a range between for example 20 and 50 Hz. In order to keep the interference voltage difference in the event of interferences of the kind that can be introduced by the plus line 11 as large as possible, the highest possible amplitude of the AC voltage is selected. In the present embodiment, the amplitude of the AC voltage is above the voltage of the DC circuit of 48 V.

The voltage signal of the signal source 22 with the signal curve MP1 30, starting from the measuring point MP1 27.1, is coupled into the feed 13.1 of the detection conductor 13 via the series resistor 24 and the incoupling point 21.1, is conveyed by this feed in accordance with FIG. 2 along the cable 10 and the loop 13.3 to the return 13.2, is coupled out of the detection conductor 13 at the outcoupling point 21.2, and is conveyed on to the measuring point MP2 27.2. The comparator 23 compares the signal curve MP1 30 at the measuring point MP1 27.1 to the signal curve MP2 31 at the measuring point MP2 27.2. In the present case, no arc is present along the course of the detection conductor 13 so that the detection conductor 13 is not electrically charged. The signal curve MP2 31 at the end of the detection conductor 13 therefore corresponds in its amplitude, but also in its phase and frequency, to the signal curve MP1 30 at the measuring point MP1 27.1 before the series resistor 24. Then a processing device, not shown, decides that no arc is present.

Figure 4:
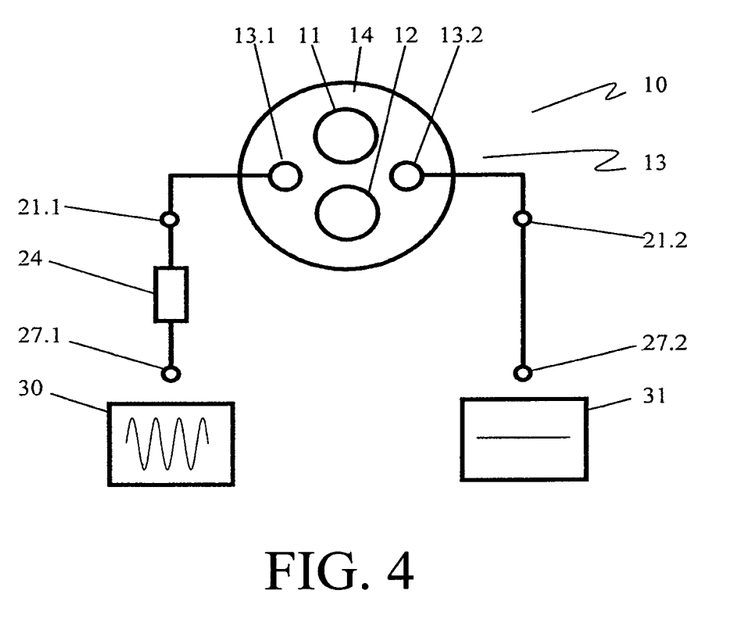
FIG. 4 shows the cable from FIG. 1 with the signal curves for comparison from FIG. 3, when an arc is occurring.

FIG. 4 shows the cable 10 shown in FIG. 1 with the signal curves 30, 31 for comparison from FIG. 3, when an arc is occurring. If an arc occurs, for example inside the cable 10 or at the consumer 17 shown in FIG. 2, then a current flows from the detection conductor 13 to the DC circuit. The detection conductor 13 is thus electrically charged so that a drop occurs in the voltage signal output by the signal source 22 via the series resistor 24. In the present exemplary embodiment, the detection conductor 13 is so powerfully charged by the short circuit through the ionized atmosphere of the arc that the voltage signal at the end of the detection conductor 13 completely collapses in accordance with the signal curve MP2 31. The comparator 23 shown in FIG. 2 measures the difference between the signal curve MP1 30 before the series resistor 24 and the signal curve MP2 31 at the end of the detection conductor 13 and based on the detected difference, the processing device, not shown, detects an arc in the DC circuit.

FIG. 5 shows the electronic assembly 20 for detecting arcs shown in FIG. 2, with an integrated safety circuit 40 for the monitoring and maintenance of the detection conductor 13. Components that have already been shown in FIG. 2 are provided with the same reference numerals. To simplify the depiction, the components of the DC circuit are not shown, unlike in FIG. 2. For example, the DC circuit is part of a 48 V electrical system of a motor vehicle.

The electronic assembly 20 also includes a maintenance and diagnosis unit 40. Starting from a power supply 41, this unit includes a first relay 42, a resistance 43, and a second relay 45.

The power supply 41 can be connected via the first relay 42 to the resistance 43, whose opposite end is connected via the incoupling point 21.1 to the feed 13.1 of the detection conductor 13. The end of the detection conductor 13 is connected via the outcoupling point 21.2 to the second relay 45, which when switched produces a connection to ground 19. A measuring point 44.1, 44.2 is provided at the beginning and end of the detection conductor 13.

The maintenance and diagnosis unit 40 is used for performing maintenance on contacts of the arc detection device, particularly in order to prevent high transition resistances due to corrosion. Such high transition resistances can, for example, occur at the contacts of the detection conductor 13 located at the contact points 15.1, 15.2. After the DC circuit is switched off, for example after the engine of a motor vehicle is switched off, the relays 42, 45 are closed for a predetermined length of time, for example for 30s. In this time, a regeneration current flows from the power supply 16 via the first relay 42, the feed 13.1, the loop 13.3, and the return 13.2 of the detection conductor 13 with the contact points 15.1, 15.2 provided therein, and via the second relay 45 to ground 19. The regeneration current in this case is set, for example, to 1 ampere through an appropriate choice of the power supply 41 and the resistance 43. Such an intermittently applied regeneration current reliably prevents a creeping corrosion of the contacts. In this case, the transition resistances at the measuring points 44.1, 44.2 are tested over the entire length of the detection conductor 13, for example at greater than 500 mΩ. If higher transition resistances are nevertheless present, a corresponding fault message is generated and the repair shop or a driver receives a maintenance notice in advance. Safety is nonetheless assured with the present passive safety system because an arc continues to be detected even in the presence of elevated transition resistances. High transition resistances can only lead to an erroneous arc detection, which can be avoided by the maintenance and diagnosis unit 40.

Figure 6:
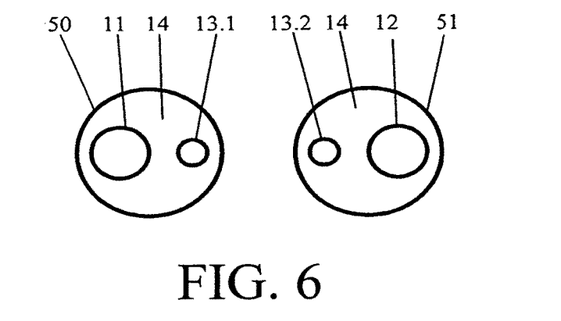
FIG. 6 shows a cable pair with a monopolar plus cable and a monopolar minus cable.

FIG. 6 shows a cable pair in an embodiment variant of this invention, with a monopolar plus cable 50 and a monopolar minus cable 51. The plus line 11 and the feed 13.1 of the detection conductor 13 are routed inside the casing 14 of the plus cable 50. The minus line 12 and the return 13.2 of the detection conductor 13 are routed inside the casing 14 of the minus cable 50. The feed 13.1 and the return 13.2 at the end of the plus cable 50 and minus cable 51 are connected to a loop 13.3 shown in FIGS. 2 and 5 to form a closed conductor loop.

In motor vehicles with 42 V or 48 V electrical systems that are currently in the planning stages, both the positive and the negative voltage are often conveyed to the consumers via insulated lines (such as plus lines 11) and minus lines 12 and the use of a shared vehicle ground is omitted. The reason behind this is the risk of the plus cable 50 possibly being damaged, for example against sharp-edged parts of the body, which can result in an immediate short circuit with the risk of arc production. This risk is significantly reduced by the separate supply of positive and negative voltage via separate plus lines 11 and minus lines 12. In comparison to the bipolar cables 10 shown in FIGS. 1, 3, and 5, in which both the plus line 11 and the minus line 12 are routed together, the danger of a short circuit can be further reduced in this case through the use of separate monopolar plus cables 50 and monopolar minus cables 51. With the cable pair shown, it is also possible to monitor such monopolar plus cables 50 and minus cable 51 for arcs, thus further increasing the operational reliability.

Figure 7:
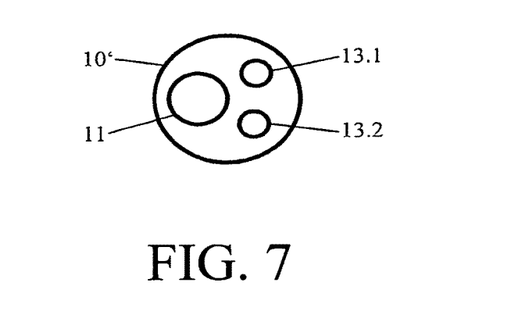
FIG. 7 shows a monopolar cable (plus line) with a detection conductor alongside the plus line.
Figure 8:
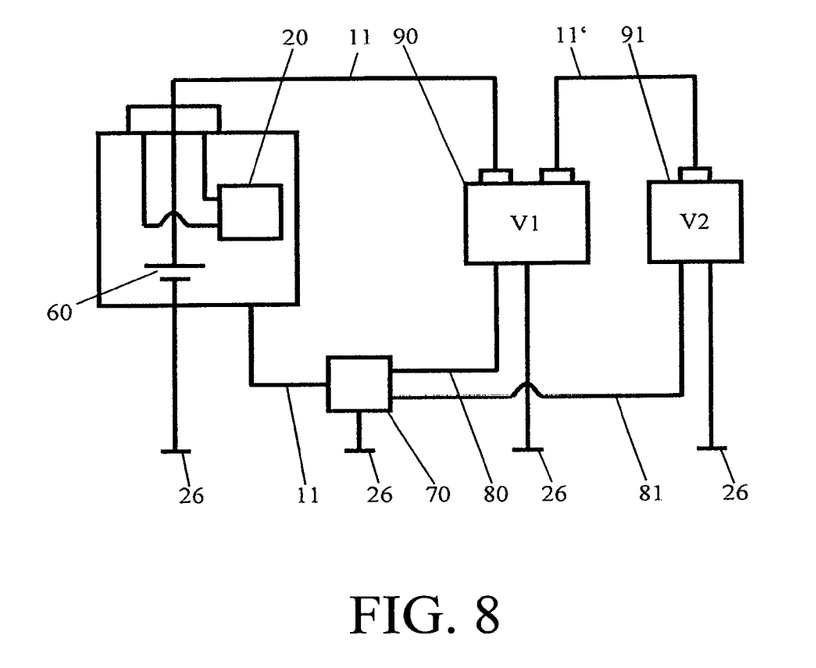
FIG. 8 shows another embodiment for a circuit with an electronic assembly.

If the motor vehicle is equipped with an arc detection according to the invention, with a shutoff of the DC circuit when an arc is detected, then even in a 42 V electrical system or a 48 V electrical system, the body can be used in an economically advantageous fashion as the minus pole (as a rule). As a result, it is only necessary to route a plus cable 50 to the consumer 17 and to monitor it with a detection conductor 13, while the negative connection of the consumer 17 is connected to the vehicle ground, as shown in FIG. 8. If, as described above, an arc occurs between the plus line 11 and the vehicle ground, then the detection conductor detects this immediately and the power supply of the DC circuit is immediately interrupted, thus ensuring safety. Eliminating the minus line 12 makes it possible to significantly reduce the costs for the electrical wiring of the motor vehicle. It is also possible to reduce the weight of the motor vehicle. In a modification of the plus cable 50 shown in FIG. 6, the detection conductor 13 is routed, preferably together with its feed 13.1 and return 13.2 that are connected at one end via a loop 13.3, alongside or in the plus cable 50, as shown in FIG. 7. As a result, there is a closed conductor loop or closed loop network.

In the embodiment with the electronic assembly 20 shown in FIG. 8, the vehicle ground or the body forms or constitutes the minus pole. In this case, a battery 60 powers two consumers 90, 91, for example. The return current flows via the vehicle ground. With return flows via the vehicle ground, however, the way that the current will flow locally is not defined. For example if the consumer is screwed to the vehicle ground with two screws in order to produce the minus contact and these screws are not tightened, then it is not possible to predict which of these two screws is the one where arcs will occur. Basically, with a conductor that has a large area such as the vehicle frame or the body, one can no longer stumble upon the position of a potential arc by a detection line. There remains, however, the problem of the series arc along the ground connection. In this case, an assembly like the one shown in FIG. 8 is advantageous. For each consumer 90, 91 with the stub lines 80 and 81, which if possible extend into the consumers 90, 91, a measuring device 70 performs a comparison to make sure that all of the consumers have the same ground relative to the battery 60. Since the arc threshold lies at roughly 18 volts, it is sufficient to set the response threshold at ground differences of greater than 5 to 10 volts. This is very easy to demonstrate and is highly effective. The electronic assembly 20 is preferably closely connected to the battery.

In the exemplary embodiment according to FIG. 8, the plus lines 11 and 11' can be embodied as shown in FIG. 7. This achieves a defined closed loop network and avoids the need for distributor boxes for the supply voltage. In this assembly, the plus line has a protection against all types of arcs, namely circuit-breaking arcs and short-circuit arcs. The ground line via the vehicle frame is only protected against circuit-breaking arcs, but this is sufficient.

When switching off the supply voltage (for example of 48 V) by circuit breakers such as relays and/or pyrotechnic fuses, it should be noted that in addition to the battery, it is also necessary to disconnect the generator or alternator. A high safety standard is advantageously achieved with the electronic assembly 20 in connection with the evaluation and shut-off electronics by providing two microprocessors that monitor each other.

Many high-current connections in a 48 volt supply voltage are screw-connected. In this case, it is advantageous to embody the contacting of the closely adjacent detection line so that the detection conductor is first disconnected before the screw can be actuated. This achieves the fact that such a screw cannot be undone when under load. With plug contacts, lagging detection contacts are advantageous in the same way during the plugging so that contacts cannot be opened or closed when under load.

Luxury busses often have 24-volt cable lengths that are often more than 10 km long. These 24 volt cables form or constitute a very real danger source. A frequent mishap in busses is that a fire in the engine compartment causes the insulation of power cables in the engine compartment to melt, these lines come into contact with the vehicle frame, and arcs cause the bus to be engulfed in a sea of flames. In this regard, it is necessary to bear in mind that the technical voltage of a bus when its engine is running amounts to 28 volts and for comparison, 30 volts are used in arc welding, for example when welding together armor plates.

One solution in busses, as is also being considered in passenger car concepts at this time, is to embody only 1 to 2% of the relevant supply lines with a 24-, 36-, or 48-volt nominal voltage in busses and thus to provide a protection by the measures explained above. In such busses, the remainder of the bus can be operated at 12 volts and with 2 or 3 distributed 12-volt backup batteries. A starting configuration with 24 volts for the relevant supply lines and 12 volts for the remainder of the bus is advantageous because all of these components already exist.

The invention claimed is:

1. A method for detecting arcs in a power supply conductor of the DC circuit which carries an electric voltage, the method comprising:
   providing an electronic assembly (20) including a generator (22), a series resistor (24), an incoupling point (21.1), and an outcoupling point (21.2);
   providing a detection conductor (13) comprising a closed conductor loop routed along the power supply conductor of the DC circuit, the detection conductor (13) coupled to the generator (22) at the incoupling point (21.1) via the series resistor (24), and an opposing end of the closed conductor loop coupled out of the detection conductor (13) at the outcoupling point (21.2);
   producing with the generator (22) a voltage signal through the closed conductor loop, the voltage signal corresponding to a potential of the power supply conductor of the DC circuit;
   comparing the voltage signal before the series resistor (24) to a return voltage signal at the outcoupling point (21.2); and
   monitoring the power supply conductor of the DC circuit using the detection conductor (13) by determining that an arc has occurred when the return voltage signal at the outcoupling point (21.2) deviates from the voltage signal before the series resistor (24) by more than a predetermined amount.

2. The method of claim 1, wherein the closed conductor loop is electrically separate from the power supply conductor of the DC circuit.

3. The method according to claim 1, wherein a DC voltage signal, an AC voltage signal, or a DC voltage signal that is overlaid with an AC voltage is used as the voltage signal.

4. The method according to claim 1, wherein the power supply of the DC circuit is interrupted when an arc is detected.

5. A use of the method and device according to claim 1, for monitoring a DC circuit in a voltage range between 24 V and 60 V or for monitoring a DC circuit in a motor vehicle in a voltage range between 40 V and 50 V.

6. A device for detecting arcs in a power supply conductor of a DC circuit which carries an electric power voltage, the device comprising:
- a detection conductor (13) including a closed conductor loop routed along the power supply conductor of the DC circuit and configured to carry an electric signal to be monitored;
- a signal source configured to produce a voltage signal corresponding to a potential of the power supply conductor of the DC circuit;
- a series resistor (24) connected between the signal source and an incoupling point (21.1) with the closed conductor loop;
- a comparator (23) at an outcoupling point (21.2) of the closed conductor loop; and
- a processing device in combination with the comparator and configured to detect an arc in the power supply conductor of the DC circuit when the voltage signal at the outcoupling point (21.2) deviates from the voltage signal output by the signal source (22) by more than a predetermined amount.

7. The device according to claim 6, wherein each of the incoupling point (21.1) and the outcoupling point (21.2) located at an opposing end of the conductor loop.

8. The device according to claim 7, wherein at contact points (15.1, 15.2) of the DC circuit to be monitored, the detection conductor (13) is likewise embodied as a contact and/or the contact of the detection conductor (13) is embodied as an interlock circuit with a delay device for the opening of the contact point.

9. The device according to claim 8, wherein the detection conductor (13) is routed electrically separate through consumers (17) or alongside the consumers (17) of the DC circuit and/or the detection conductor (13) is routed electrically separate through cables (10, 50, 51) or alongside cables (10, 50, 51) of the DC circuit.

10. The device according to claim 9, wherein the series resistor (24) lies in a range between 10 ohm and 10,000 ohm.

11. The device according to claim 10, wherein the signal source (22) is embodied as an AC voltage source, a DC voltage source, or an AC voltage source with an overlaid DC voltage offset.

12. The device according to claim 11, wherein the processing device is configured to react to the detection of an arc by tripping a circuit breaker, which interrupts the power supply of the DC circuit.

13. The device according to claim 12, wherein the detection conductor (13) is insulated in at least some areas and/or the detection conductor (13) is without insulation in at least some areas.

14. The device according to claim 13, wherein consumers (17) of the DC circuit are connected to a vehicle ground on one side and the supply voltage (16) is conveyed to the consumers (17) via plus lines (11) that are monitored by detection conductors (13).

15. The device according to claim 6, wherein at a contact point (15.1, 15.2) of the DC circuit to be monitored, the detection conductor (13) is likewise embodied as a contact and/or the contact of the detection conductor (13) is embodied as an interlock circuit with a delay device for the opening of the contact point.

16. The device according to claim 6, wherein the detection conductor (13) is routed electrically separate through consumers (17) or alongside the consumers (17) of the DC circuit and/or the detection conductor (13) is routed electrically separate through cable cables (10, 50, 51) or alongside cables (10, 50, 51) of the DC circuit.

17. The device according to claim 6, wherein the series resistor (24) lies in a range between 300 ohm and 3000 ohm.

18. The device according to claim 6, wherein the signal source (22) is embodied as an AC voltage source, a DC voltage source, or an AC voltage source with an overlaid DC voltage offset.

19. The device according to claim 6, wherein the processing device is configured to react to the detection of an arc by tripping a circuit breaker, which interrupts the power supply of the DC circuit.

20. The device according to claim 6, wherein the detection conductor (13) is insulated in at least some areas and/or the detection conductor (13) is without insulation in at least some areas.

21. The device according to claim 6, wherein consumers (17) of the DC circuit are connected to a vehicle ground on one side and the supply voltage (16) is conveyed to the consumers (17) via plus lines (11) that are monitored by detection conductors (13).

22. A use of the method and device according to claim 6, for monitoring a DC circuit in a voltage range between 24 V and 60 V or for monitoring a DC circuit in a motor vehicle in a voltage range between 40 V and 50 V.

* * * * *